United States Patent
White et al.

(10) Patent No.: US 9,818,899 B2
(45) Date of Patent: Nov. 14, 2017

(54) SYSTEM AND METHOD FOR TRANSMITTING DATA USING ALTERNATIVE ENERGY SOURCES

(71) Applicant: RAINFOREST CONNECTION, San Francisco, CA (US)

(72) Inventors: Christopher Cushen White, San Francisco, CA (US); Dave Grenell, San Francisco, CA (US)

(73) Assignee: RAINFOREST CONNECTION, San Francisco, CA (US)

( * ) Notice: Subject to any disclaimer, the term of this patent is extended or adjusted under 35 U.S.C. 154(b) by 0 days.

(21) Appl. No.: 15/169,515

(22) Filed: May 31, 2016

(65) Prior Publication Data

US 2016/0353447 A1    Dec. 1, 2016

Related U.S. Application Data

(60) Provisional application No. 62/168,657, filed on May 29, 2015, provisional application No. 62/183,421, filed on Jun. 23, 2015.

(51) Int. Cl.

| | |
|---|---|
| *H04M 1/00* | (2006.01) |
| *H04B 1/38* | (2015.01) |
| *H01L 31/05* | (2014.01) |
| *H04W 4/00* | (2009.01) |
| *H04W 4/20* | (2009.01) |

(52) U.S. Cl.
CPC ......... *H01L 31/0504* (2013.01); *H04W 4/005* (2013.01); *H04W 4/20* (2013.01); *Y02E 10/50* (2013.01)

(58) Field of Classification Search
None
See application file for complete search history.

(56) References Cited

U.S. PATENT DOCUMENTS

| | | | | |
|---|---|---|---|---|
| 7,239,871 | B2 * | 7/2007 | Shamp | G06Q 30/0207 370/328 |
| 8,285,259 | B2 * | 10/2012 | Karkanias | H04L 67/303 370/238 |
| 9,048,927 | B2 * | 6/2015 | Glynn | H01M 10/465 |
| 9,262,915 | B2 * | 2/2016 | Clem | G08G 1/0112 |
| 9,419,472 | B2 * | 8/2016 | Sells | H02J 7/35 |
| 2011/0050416 | A1 * | 3/2011 | Lee | H01M 10/465 340/540 |
| 2011/0151943 | A1 * | 6/2011 | Lee | H01M 10/465 455/573 |
| 2013/0134921 | A1 * | 5/2013 | Shen | H02J 7/0052 320/101 |

* cited by examiner

*Primary Examiner* — Tuan A Tran
(74) *Attorney, Agent, or Firm* — Orrick, Herrington & Sutcliffe LLP

(57) ABSTRACT

A system and method for generating power from the low-light emissions prevalent in rainforests through a low-light emission solar panel in order to transmit data over a network. The low-light emission solar panels can be formed to have four sets of three cells wired in series, with each of the four sets of three cells wired in parallel. The power generated by the low-light emission solar panels can be used to power a cellphone, which can collect and transmit data over a network to remote users for monitoring.

17 Claims, 2 Drawing Sheets

SYSTEM AND METHOD FOR TRANSMITTING DATA USING ALTERNATIVE ENERGY SOURCES

CROSS-REFERENCE TO RELATED APPLICATIONS

This application claims priority to U.S. provisional patent application Ser. Nos. 62/168,657 and 62/183,421, filed May 29, 2015 and Jun. 23, 2015 respectively. Priority to the provisional patent application is expressly claimed, and the disclosure of the provisional applications are hereby incorporated herein by reference in their entirety and for all purposes.

FIELD

The present disclosure relates generally to transmitting data using alternative energy sources, and more specifically, but not exclusively, to real-time audio transmission systems powered by low-light solar panels.

BACKGROUND

Destruction of the tropical rainforest is a leading cause of climate change. Forests are vital to mitigating climate change because they absorb large amounts of carbon dioxide. The rainforest is the Earth's largest reservoir of carbon dioxide, absorbing around 20% of the atmospheric carbon emitted by the burning of fossil fuels. The rainforest is also the source of one-fifth of all fresh water on the planet. Websites (e.g., Amazon Watch®) provide extensive information on the rainforest's critical role in fighting climate change. See, e.g., http://amazonwatch.org/work/climate-change-and-the-amazon-rainforest.

Deforestation of the tropical rainforest is also contributing to mass extinctions at an alarming rate. According to the United Nations Environment Program, illegal logging is a $30 Billion dollar per year black market economy.

Although many rainforests are formally protected as natural resources, illegal logging activity remains the leading cause of deforestation, and accounts for as much as 15-30 percent of all wood that is traded globally. Illegal logging is able to proceed unabated, because of the corruption and consent of local government officials responsible for protecting these forests. Many local government officials accept bribes that allow illegal loggers to obtain logging permits, avoid detection and export protected lumber. Because of the lack of local oversight, the expansive area covered by the rainforests, and the remote locations, there is a need for a method and/or device that will allow remote detection of illegal logging and other activities in the rainforest in real-time. Illegal logging is just one example of the types of problems that can be solved by a real-time data transmitting system that is powered through alternative energy sources.

Transmitting data, and more specifically real-time audio, from remote areas such as the rainforest, mountains, or the desert, requires unconventional energy sources, because it is not feasible to continually change the power source, such as a battery, in the data transmitter. There is therefore a need for a renewable self-powering energy source, such as a solar panel.

Conventional solar panel configurations, however, operate effectively only when very specific conditions are met. For acceptable performance, one requirement of conventional solar panel configurations is that they be exposed to unobstructed direct sunlight. Shadows on all, or part, of conventional solar panel configurations generate weak performance and render them ineffective at generating energy. For example, conventional solar panel configurations unable to generate significant energy when the panel is placed under a tree, because the tree branche(s) and leaves cast shadows on all or part of the panel. Even a nearby flagpole casting a shadow over a conventional solar panel can inhibit energy production. Therefore, conventional solar panel configurations are most effective with full, unimpeded illumination, in which every solar cell within the panel receives direct sunlight.

The cells in conventional solar panels are typically not connected in parallel, because connecting the cells in parallel yields lower output voltages that are generally inefficient to transform into conventionally utilized voltages. A string of cells that are connected in parallel which receives incomplete illumination due to shadows can cause substantial power loss and even damage, due to the reverse bias applied to the shadowed cells by their illuminated partners. Thus, the cells in a conventional solar panel are typically connected in series. Nevertheless, even when cells are connected in series, a cell that is covered in a partial shadow will not generate energy effectively Remote real-time data transmission also requires infrastructure, such as a network, over which data can be reliably transmitted. Rainforests, mountains, and the desert often are not linked into traditional networks, such as telephone networks or the internet, which typically are built around more populated and less remote areas. There is therefore also a need for a reliable way in which to transmit data from remote areas by adapting available infrastructure.

In view of the foregoing, a need exists for an improved system and method for remote data transmission, in an effort to overcome the aforementioned obstacles and deficiencies of using conventional data transmitters, renewable energy sources and existing infrastructure.

Figure 1:
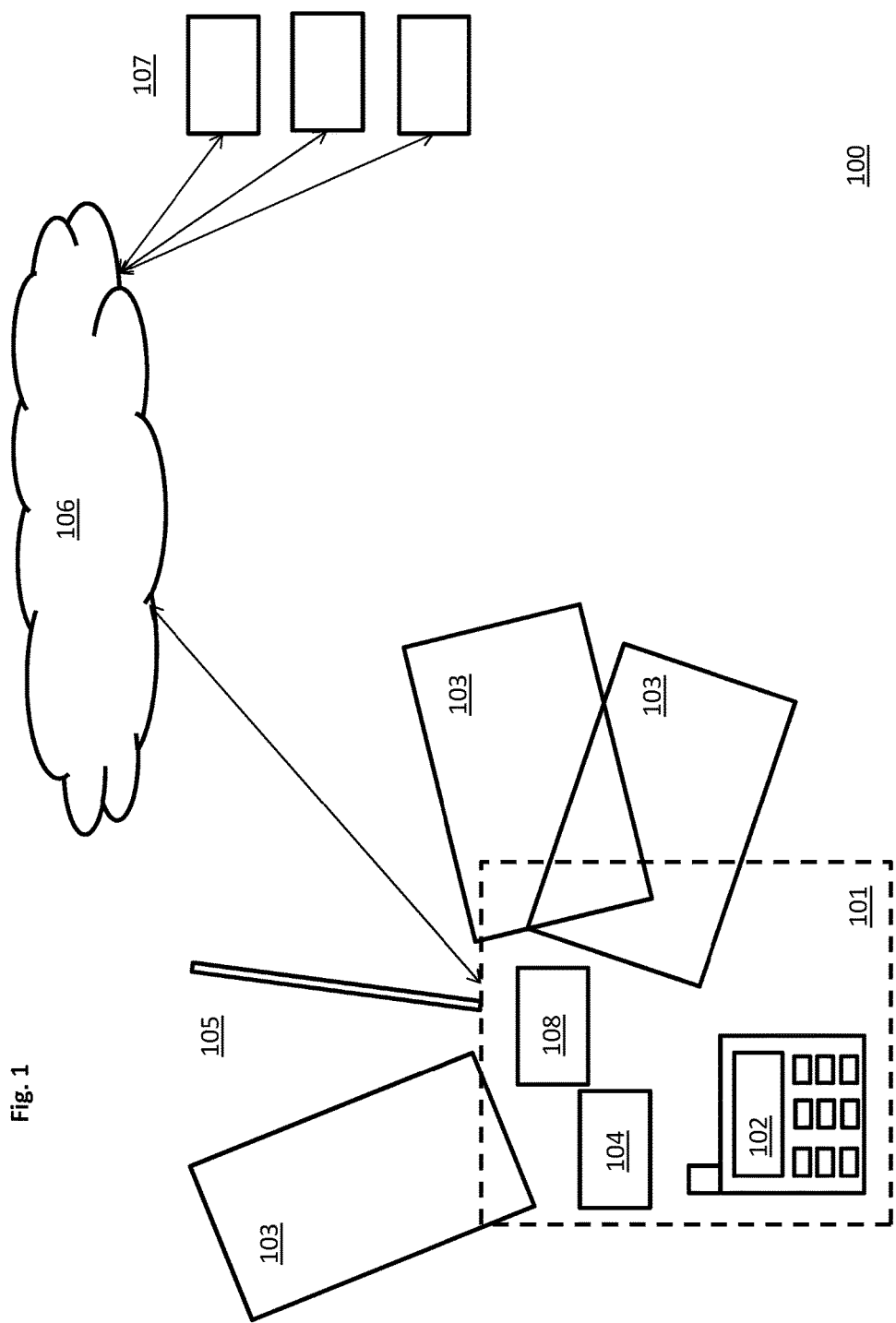
FIG. 1 is an embodiment of an exemplary remote data transmission system.
Figure 2:
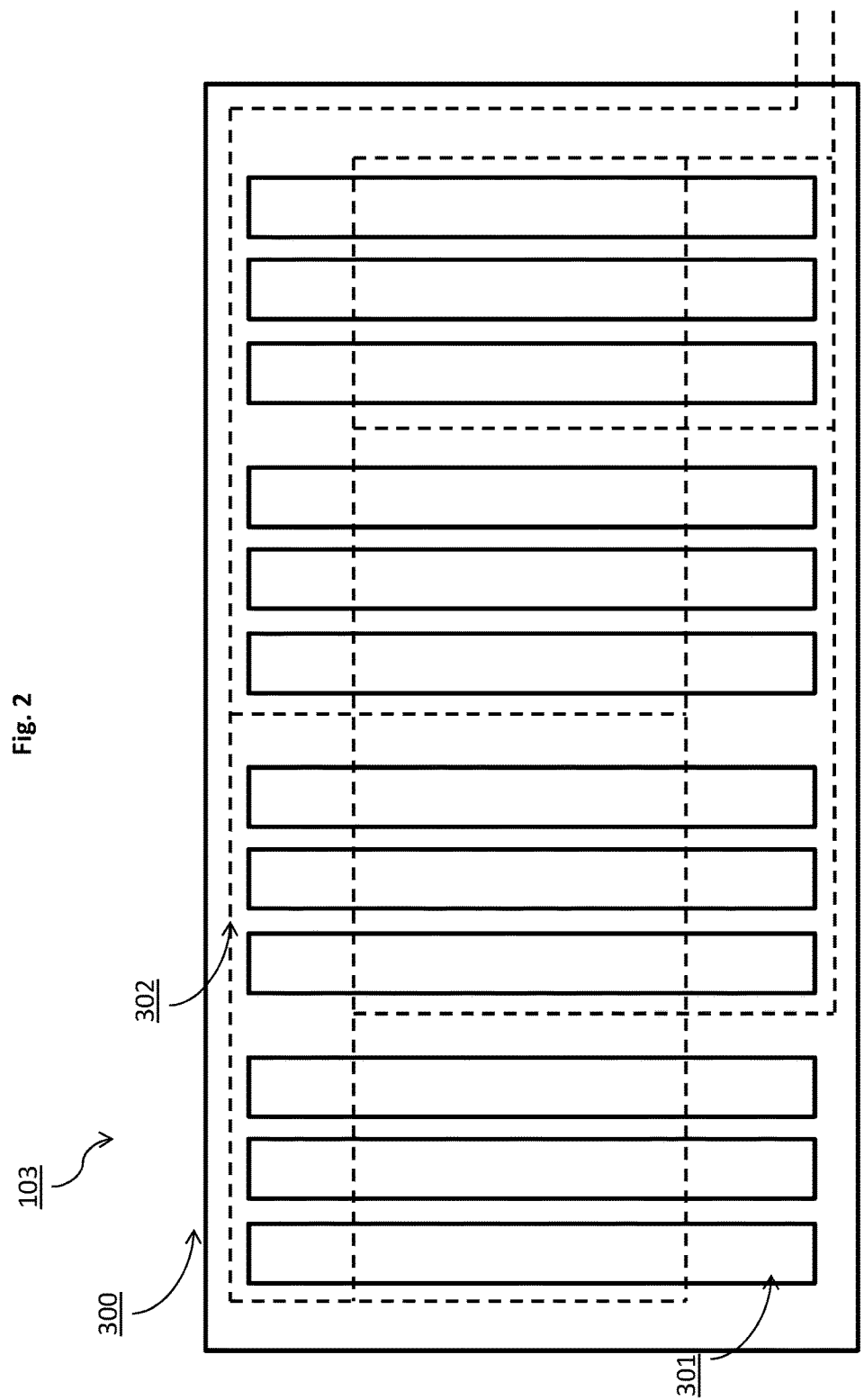
FIG. 2 is an exemplary solar panel that can be used with the remote data transmission system of FIG. 1.

It should be noted that the figures are not drawn to scale and that elements of similar structures or functions are generally represented by like reference numerals for illustrative purposes throughout the figures. It also should be noted that the figures are only intended to facilitate the description of the preferred embodiments. The figures do not illustrate every aspect of the described embodiments and do not limit the scope of the present disclosure.

DETAILED DESCRIPTION OF THE PREFERRED EMBODIMENTS

As discussed above, there is a need for a remote data transmission system that is capable of transmitting real-time data from remote areas over existing infrastructure powered by renewable energy sources. This result can be achieved, according to one embodiment disclosed herein, by a remote data transmission system 100 as illustrated in FIG. 1.

Turning to FIG. 1, the remote data transmission system 100 is shown as including a data receiving station 101 for receiving data and transmitting that data for use by remote users 107. The data receiving station 101 is suitable for receiving a wide range of data and/or media, including audio, video, and text, and could also be used to receive olfactory, chemical, and/or environmental data. For example, in one embodiment the data receiving station 101 can receive visual data and record a live feed of the activities surrounding the device.

The data receiving station 101 can be placed in any orientation, including vertically, diagonally, or horizontally. The data receiving station 101 can also be coupled (e.g., via string) between different objects (not shown). For example, the data receiving station 101 can be mounted on a tree, pole, branch, string, wire, chain, or fence. However, the data receiving station 101 can be mounted to any object, as desired, by any suitable mounting device, including tape, nails, wire, glue, and/or adhesive. The data receiving station 101 can be placed in remote locations by a drone, catapult, pulley system, ladder or any other mechanism by which to place an item in a hard to reach or remote place, such as a very tall tree in the rainforest.

The data receiving station 101 can include a receiving device 102 for receiving the wide range of data and/or media input. The receiving device 102 can include, but is not limited to, an antenna, a video camera, a cellphone, a voice recorder, a sonar, a chemical sensor, smoke detector, ozone monitor, electrochemical gas sensor, gas detector, rain sensor, any type of environmental sensor, air flow meter, gas meter, water meter, and/or any other type of device, sensor, or meter for receiving data. For example, as depicted in FIG. 1, the receiving device 102 can be a cellphone. The cellphone can be any type of cellphone including a used cellphone, a refurbished cellphone, an Android® cellphone (from Samsung®, Nokia®, etc.), an Apple® smart phone, and any version or type thereof. The receiving device 102 can also include any customized cellphone or other device for receiving data.

In other embodiments, the receiving device 102 can be designed to receive data beyond acoustical data. For example, in some embodiments, the remote data transmission system 100 can receive video input through the receiving device 102 (e.g., such as via a digital camera, video camera, analog camera, and/or sonar device). Additionally and/or alternatively, the receiving device 102 can receive and/or measure environment quality data including air composition, presence of chemicals, pollution, and debris in the air and/or water. Similarly, in some embodiments, the remote data transmission system 100 can detect and/or measure for certain types of chemicals, or elements in the environment that it is monitoring. Similarly, in additional embodiments, the remote data transmission system 100 can measure electromagnetic variations, seismic events, illumination changes, and/or charged particle flux (including cosmic rays and/or nuclear decay).

In yet another embodiment, the receiving device 102 is a cellphone. In addition the remote data transmission system 100 also includes a supplemental receiving device (not pictured). The supplemental receiving device can include a video camera, a voice recorder, a sonar, a chemical sensor, smoke detector, ozone monitor, electrochemical gas sensor, gas detector, rain sensor, any type of environmental sensor, air flow meter, gas meter, water meter, and/or any other type of device, sensor, or meter for receiving data. The supplemental receiving device sends the received data to a data converter. In some embodiments, the data converter can be a CPU 104. The data converter then sends the data to the receiving device 102 (e.g., cellphone). In this embodiment, the receiving device 102 (e.g., cellphone) is able to receive different types of data, not just acoustic data.

In still another embodiment there can be any number (1, 2, 3, 4, 5, 6, 7 . . . 100 . . . n) of supplemental receiving devices in order to receive multiple types of data.

In another embodiment, the data receiving station 101 may further include a user interface configured to allow a person to interact directly with the data receiving station 101 through one or more: touchscreens, buttons, audio signals (i.e., voice commands or specific noises for triggering certain functions), and/or an orientation of the sensor (i.e., rotating it or shaking it).

In other embodiments, the data receiving station 101 can be waterproof in order to protect itself from the conditions present in remote locations, such as snow, rainfall, or underwater submersion. In another embodiment the data receiving station 101 is designed to withstand strong winds, severe heat, low temperatures, or any other type of adverse weather condition. In yet another embodiment, the data receiving station 101 is made of plastic. In other embodiments, the data receiving station 101 is specifically designed to protect the data receiving station 101, connect a power source 103 to the data receiving station 101, and/or mount the data receiving station 101 to a wall, tree, or other location.

As shown in FIG. 1, the data receiving station 101 can also include the central processing unit (CPU) 104 for processing data. The CPU 104 can include any type of processor, including, but not limited to a single core, a dual core, or a quad core. For example, the CPU 104 can include: Intel® core, Intel Pentium®, Intel Atom®, AMD FX®, AMD A-Series®, AMD Phenom II®, AMD Athlon II®, AMD Turion II®, AMD Sepron®, etc. The data receiving station 101 can also include a memory 108 for storing data.

The data receiving station 101 can further include an antenna 105 to transmit data and/or media to a network 106. The network 106 includes any number of wired data networks and/or any conventional wireless communication network, for example, radio, Wireless Fidelity (Wi-Fi), cellular, satellite, and broadcasting networks. Exemplary suitable wireless communication technologies used with the network 106 include, but are not limited to, Global System for Mobile Communications (GSM), General Packet Radio Service (GPRS), Code Division Multiple Access (CDMA), Wideband CDMA (W-CDMA), CDMA2000, IMT Single Carrier, Enhanced Data Rates for GSM Evolution (EDGE), Long-Term Evolution (LTE), LTE Advanced, Time-Division LTE (TD-LTE), High Performance Radio Local Area Network (HiperLAN), High Performance Radio Wide Area Network (HiperWAN), High Performance Radio Metropolitan Area Network (HiperMAN), Local Multipoint Distribution Service (LMDS), Worldwide Interoperability for Microwave Access (WiMAX), ZigBee, Bluetooth, Flash Orthogonal Frequency-Division Multiplexing (Flash-OFDM), High Capacity Spatial Division Multiple Access (HC-SDMA), iBurst, Universal Mobile Telecommunications System (UMTS), UMTS Time-Division Duplexing (UMTS-TDD), Evolved High Speed Packet Access (HSPA+), Time Division Synchronous Code Division Multiple Access (TD-SCDMA), Evolution-Data Optimized (EV-DO), Digital Enhanced Cordless Telecommunications (DECT) and others.

The antenna 105 can include any type of antenna for transmitting data and/or media, including but not limited to a wire antenna, travelling wave antennas, reflector antennas, microstrip antennas, aperture antennas, Yagi antennas, directional antenna, or log-periodic antennas. The antenna 105 can send any type data to the network 106, including raw audio, environmental data, temperature data, alerts related to sounds of interest, analytics about the functionality of the remote data transmission system 100 itself, or data about the best placement of the data receiving stations 101. In one embodiment, the antenna 105 sends real-time audio data from its surroundings, so that the rainforest can be monitored by the remote users 107 for certain types of sounds, such as a tree being cut down, fire, certain types of animals, large vehicles, voices, and any other sound of interest.

In one embodiment, the antenna 105 may be coupled to the cellphone 102. By coupling the antenna 105 to the cellphone 102, the remote data transmission system 100 is able to transmit data over the network 106.

In another embodiment, the antenna 105 sends alerts. An alert can be generated when the receiving device 102 sends data to the CPU 104. The CPU 104 analyzes the data and determines whether an event has occurred. For example, if the CPU 104 determines that the sound associated with a tree being cut down or a forest fire has occurred, then the CPU 104 sends the alert to the antenna 105 and the antenna 105 transmits the alert over the network 106 to the remote users 107. In alternative embodiments, the antenna 105 over the network 106 to organizations that monitor rainforest activities, to an application that analyzes the data received by the receiving device 102, or to a remote computer for data storage.

The data received by the remote data transmission system 100 can be analyzed by the CPU 104 in the data receiving station 101, by the network 106, by the remote user 107 devices, and/or by the users. Many different types of data analysis can be performed depending on the goal of the remote data transmission system 100.

In one embodiment, the data is analyzed in order to determine an optimal formation of placement of the data receiving stations 101 throughout the environment that is being monitored, such as a rainforest. For example, in a large rainforest, it can be initially unclear how many data receiving stations 101 are needed or where they should be placed relative to each other. In order for the rainforest to be effectively monitored, audio data from the whole rainforest, or substantially the whole rainforest, is needed. Therefore the data received from the data receiving stations can be analyzed in order to determine if their placement is covering the whole rainforest, and if more or less are needed, and where they should be placed. Other self-analytics that the remote data transmission system 100 can perform, in this or another embodiment, include troubleshooting, system recovery, network outages, and ways to make the network 106 more reliable.

The data receiving station 101 can also include a power source 103. The power source 103 can include solar panels, batteries, electricity, and any other type of power source. In one embodiment, the data receiving station 101 can use one or more solar panels as the power source 103.

In at least one embodiment, the power source 103 are specifically designed for low-light emissions prevalent in the rainforest. Because of the rainforest's thick canopy, small amounts of light are let through, typically in the form of short-lived, unpredictably placed beams of direct sunlight, called sunflecks. As previously discussed, conventional solar panels are ill-suited for low-light emissions such as sunflecks because conventional solar panels are wired in series. If any portion of the solar panel is covered in shadow, then the solar panel will be ineffective at generating power.

As discussed, the power source 103 can include any number of solar panels, batteries, electricity, and any other type of power source, such as the exemplary low-light solar panel 300 shown in FIG. 3. The low-light solar panel 300 has four sets of three cells 301 wired 302 in series. Each of the four sets of three cells 301 is then wired in parallel via wiring 302. Although FIG. 3 depicts four sets of cells 301, there can be any number of sets of cells 301, including 1, 2, 3, 4, 5, 6, 7 . . . 100 . . . n. In addition, although FIG. 3 depicts three cells 301 in each set, there can be any number of cells in each set, including 1, 2, 3, 4, 5, 6, 7 . . . 100 . . . n. Further, although FIG. 3 depicts the cells 301 as a slim rectangular shape, each cell 301 can be any shape. The shape of the cell 301 will often reflect the type of environment that the low emitting solar panel is placed in, and could include a square, triangle, circle, or any other geometric shape. In the embodiment shown in FIG. 3, the cells 301 are long rectangles because this is an ideal shape for catching sun flecks.

Each cell 301 can be made of monocrystalline, nanocrystalline, polycrystalline, crystalline silicon, ribbon silicon, silicon, polysilicon, amorphous silicon, thin film, mono-like-multi-silicon, Cadmium telluride, Copper indium gallium selenide, Gallium arsenide, and/or other organic materials.

The wiring 302 can be made of aluminum, copper, or other conductive material. The wiring 302 can be solid or stranded. The wiring 302 can have insulation to protect it from heat, moisture, ultraviolet light, chemicals or other adverse conditions. The wiring 302 can also be a metal ribbon.

Likewise, although the low-light solar panel 300 in FIG. 3 is depicted as a rectangle, the low-light solar panel 300 can be any shape that is needed for the environment, and could include a square, triangle, circle, or any other geometric shape.

The remote data transmission system 100 includes the network 106 for transporting the data from the data receiving station to remote users 107. As discussed, the network 106 can include a radio, cellular, internet, intranet, cloud, telephonic, satellite, communication network and/or any other type of network suitable for transmitting data, or any combination thereof.

In another embodiment, in the event that there is no network 106, the remote data transmission system 100 can store received data in a memory. The remote data transmission system 100 may receive and store data over the span of a day, month, year, or other interval of time. When the network 106 is restored the remote data transmission system 100 may then off-load the stored data. Alternatively, the stored data may be manually off-loaded to a drone, memory stick, external hard-drive, or any other storage device suitable for storing data.

The remote user 107 devices that receive the data from the network 106 can include a cellphone, personal computer, bot, application, etc. The remote device can include any type of computer with an output for a user to view the data. In one embodiment, the remote user device can be configured for use by a user. In an alternative embodiment, the remote user 107 device is instead a computer processing device that performs further data processing and/or sends the data to an application. The remote user 107 devices can further include a cellphone, a tablet, a laptop, a data center, a cloud computer, or grid computer.

The CPU 104 can perform analysis on the input data and/or media. Scatterplots of the analysis of data received by the system and analyzed, related to a car, motorcycle, truck and chainsaw are attached to this application. This is one type of analysis of such data.

In one embodiment, the remote data transmission system 100 is used for transmitting data from a remote rainforest to the cloud network. From the cloud network users can analyze the data received to determine if illegal logging is threatening that portion of the rainforest.

In another embodiment, the remote data transmission system 100 is used to monitor the border in between countries. Remote borders are difficult to monitor. The remote data transmission system 100 may be used to monitor traffic or incursions at great distance by placing devices a long borders and helping detect various kinds of crossovers.

In yet another embodiment, the remote data transmission system 100 is used to monitor airplanes.

In another embodiment, the remote data transmission system 100 is used to monitor gunshot locations. The remote data transmission system 100 can be able to provide early warnings of remote gunshots, and/or pinpoint where the gunshot occurred. This could be applied to many different circumstances, including a battle zone, law enforcement or a hunting zone.

In another embodiment the remote data transmission system 100 is used to monitor a baby in a home, while the parents are elsewhere.

In another embodiment the remote data transmission system 100 is used to monitor a home or business and detect whether a burglary or any other unwanted activity, such as vandalism is occurring on the property. The remote data transmission system 100 can monitor for breaking glass, footsteps, and/or voices in the house. The remote data transmission system 100 can also be able to distinguish between the data collected from each of these occurrences and perform data analysis. Burglar alarm: alerts for (breaking glass, footsteps, voices in the house)

In another embodiment the remote data transmission system 100 is used for machinery and infrastructure monitoring. The remote data transmission system 100 may be used to monitor and send an alert for atypical humming, frequencies or noises related to equipment, factory operations or power plant regulation features thereby letting technicians know when machinery is making important transitions or needs to be checked, is beginning to wear down, break or change in a way that can be detected through emitted sounds.

In another embodiment the remote data transmission system 100 is used for biomonitoring in forests for ecosystem health footprints climate patterns (year over year comparisons), insect populations (year over year comparisons), bird populations, temperature and humidity and rainfall measurements (comparisons). It would be particularly helpful for remote and/or isolated environments.

In another embodiment the remote data transmission system 100 is used to perform animal sound recognition and provide alerts based on the animal.

In another embodiment the remote data transmission system 100 is used as a method for earthquake detection, including monitoring earthquakes, and providing early alert systems.

In another embodiment the remote data transmission system 100 is used to detect chemicals and provide an alert of a chemical leak. For this embodiment, the remote data transmission system 100 can include a data detector that detects more than just sounds, but also air composition, and/or moisture in the area.

In another embodiment the remote data transmission system 100 is used to detect pollution in the air and/or water and provide an alert. For this embodiment, the remote data transmission system 100 can include a data detector that detects more than just sounds, but also air composition, and/or moisture in the area.

In another embodiment the remote data transmission system 100 is used to detect marine debris measurements. For this embodiment, the remote data transmission system 100 can include a data detector that detects more than just sounds, but also smells, and/or moisture in the area.

In another embodiment the remote data transmission system 100 is used to detect sonar buoy.

In another embodiment the remote data transmission system 100 is used to detect deployable audio periscope or buoy for submarines.

In another embodiment the remote data transmission system 100 is used to detect deployable underwater sensor for acoustic signatures, event readings (underwater volcanoes, underwater earthquakes).

In another embodiment the remote data transmission system 100 is used to detect underwater bio-monitoring. In this embodiment, the system could be protected by known techniques of waterproofing.

In another embodiment the remote data transmission system 100 is used to detect events occurring in coral reef ecosystems. In this embodiment, the system could be protected by known techniques of waterproofing.

In another embodiment the remote data transmission system 100 is used to monitor underwater ecology health.

In another embodiment the remote data transmission system 100 is used for real time medical transmission for heart arrhythmia, cardiac arrest, etc. In this embodiment the remote data transmission system 100 can be much smaller than the previously described embodiments, so that it can be worn by a person. The data transmission system can also detect perspiration, sounds of the heart, and/or blood sugar level.

In another embodiment the remote data transmission system 100 is used for stethoscope monitoring of vital signs in the womb, baby's heart beat and other, still birth. In this embodiment the remote data transmission system 100 can be much smaller than the previously described embodiments, so that it can be worn by a person. The remote data transmission system 100 can also detect perspiration, sounds of the heart, and/or blood sugar level.

In another embodiment the remote data transmission system 100 is used for a personalized data transmission system, in which the user and/or customer can create their own signature alert system, paste and copy a certain sound that they wish to monitor into a GUI or software associated with the remote data transmission system 100. The remote data transmission system 100 will them monitor for that customized sound, and provide an alert every time that sound is detected. The remote data transmission system 100 could also provide a customized output based on the user and/or customer specification, including send a text message or email when the sound is heard.

In another embodiment the remote data transmission system 100 is used for soundscape ecology disruption analysis. The remote data transmission system 100 can analyze how ecosystems change in response to disruptions, airplane overflight, heavy machinery, or areas under stress from mining, milling, lumbering, using sound based monitoring.

In another embodiment, the remote data transmission system 100 is used for noise pollution detection and analysis. Factories, work places, assembly lines and communities are affected by noise pollution. Multiple studies show that noise pollution above a certain threshold has negative effects on human beings. In work place situations, in assembly lines as well as open office environments, many studies show worker productivity declines up to 60% due to noise pollution. Smart cities, smart buildings and smart work environments which monitor and regulate various activities based on noise levels will be important in the future, including for development projects and Environmental Impact Reports that take into account environmental factors including noise.

In another embodiment the remote data transmission system 100 is used for biodiversity monitoring. The remote data transmission system 100 can utilize benchmark healthy ecology soundscape baselines to establish remediation protocols for mining, lumber extraction and restoration of habitats to "health."

In another embodiment the remote data transmission system 100 is used for invasive species monitoring. The remote data transmission system 100 can monitor for the noises of certain kinds of invasive species, such as beetles or frogs, detect when the noises of certain kinds of invasive species are present, and send alerts to individuals or corporations that require information related invasive species infestation, such as park services, thereby allowing professionals to stop further invasion and protect trees or local ecologies to contain spread.

In another embodiment the remote data transmission system 100 is used for EKG streaming/analytics to establish biorhythm and detect noise pollution, for example in areas with intense noise pollution, such as factories with loud equipment. The remote data transmission system 100 can measure the effects of sound polluting environments on people's biorhythms and analyze effects/disruptions.

In another embodiment the remote data transmission system 100 is used for measuring the nervous system including pulse diagnosis and biorhythm resets when live streaming sounds of an environment, such as a rainforest. The remote data transmission system 100 can measure complex polyphonous sounds of the environment, and according to Chinese medicine help to tune the nervous system and reset biorhythms to health The data received by the remote data transmission system 100 can be analyzed by the CPU 104 in the data receiving station 101, by the network 106, by the remote user devices 107, and/or by the users. Many different types of data analysis can be performed depending on the goal of the system.

In one embodiment, the data is analyzed in order to determine an optimal formation of placement of the data receiving station 101. For example, in a large rainforest it can be initially unclear how many data receiving stations 101 are needed, and where they should be placed, in order to effectively monitor the whole rainforest. In order to be effectively monitored, audio data from the whole rainforest, or substantially the whole rainforest, is needed. Therefore the data received from the data receiving stations can be analyzed in order to determine if their placement is covering the whole rainforest, and if more or less are needed, and where they should be placed. Other self-analytics that the system can perform, in this or another embodiment, include troubleshooting, system recovery, network outages, and ways to make the network more reliable.

In one embodiment, after the user receiving device 107 receives the data, the user receiving device 107 can transfer the data to an application in the cloud and/or on the network. The application can identify what type of sound is associated with the audio data. In another embodiment, the application can create an alert and/or notification based on the type of sound that is heard. That alert can then be sent to a user, law enforcement, or automated system designed for accepting alerts.

In another embodiment, after the user receiving device 107 receives the data, the user receiving device 107 can transfer the data to a research facility, where scientists can use the data to perform analytics and sound analysis.

The described embodiments are susceptible to various modifications and alternative forms, and specific examples thereof have been shown by way of example in the drawings and are herein described in detail. It should be understood, however, that the described embodiments are not to be limited to the particular forms or methods disclosed, but to the contrary, the present disclosure is to cover all modifications, equivalents, and alternatives.

What is claimed is:

1. A system for remote data transmission to at least one remote user device, comprising:
   two or more solar panels configured to generate power from low-light emissions;
   a receiving device configured to receive the generated power from the one or more solar panels and further configured to receive data; and
   an antenna operatively coupled to the receiving device and configured to transmit the received data to the at least one remote user device over a network;
   wherein each of the two or more solar panels has at least two or more sets of at least two cells wired in series, and each of the sets of cells wired in series are wired together in parallel.

2. The system of claim 1, wherein each of said solar panels has one or more additional set of at least two cells wired in series, wherein the one or more additional set is wired together in parallel with the first and second sets.

3. The system of claim 1, wherein the receiving device is a cellphone.

4. The system of claim 1, wherein the receiving device is further comprised of a memory configured to store the received data.

5. The system of claim 1, wherein the receiving device is further comprised of a central processing unit configured to analyze the received data.

6. The system of claim 1, wherein the receiving device is further comprised of a video camera configured to receive video input.

7. The system of claim 1, wherein the network is a cloud-based network.

8. The system of claim 1, further comprising at least one environmental sensor operatively coupled to the receiving device.

9. The system of claim 8, wherein the at least one environmental sensor is configured to receive environment quality data.

10. A method for remote data transmission to at least one remote user device, comprising:
    converting low-light emissions into a power supply;
    receiving data at a receiving device; and
    transmitting the data over a network to the at least one remote user;
    wherein said receiving and said transmitting of the data over the network to the at least one remote user is powered by the converted power supply;
    wherein said converting low-light emissions occurs through at least two solar panels having at least two or more sets of at least two cells wired in series, and each of the sets of cells wired in series are wired together in parallel.

11. The system of claim 10, wherein each of said solar panels has one or more additional set of at least two cells wired in series, wherein the one or more additional set is wired together in parallel with the first and second sets.

12. The method of claim 10, wherein said receiving comprises receiving through a cellphone and wherein said transmitting comprises transmitting through a cellphone.

13. The method of claim 10, wherein said analyzing the data further comprises determining if illegal logging is occurring, and wherein the transmitting the data further comprises transmitting the determination of illegal logging over the network.

14. The method of claim 10, where the network is a cloud based network.

15. A system for remote data transmission to at least one remote user device, comprising:
   two or more solar panels configured to generate power from low-light emissions;
   a cellphone configured to receive power from the one or more solar panels and further configured to receive data; and
   an antenna operatively coupled to the cellphone and configured to transmit the received data to the at least one remote user device over a network; and
   an environmental sensor operatively coupled to the cellphone;
   wherein each of the two or more solar panels has at least two or more sets of at least two cells wired in series, and each of the sets of cells wired in series are wired together in parallel.

16. The system of claim 15, wherein each of said solar panels has one or more additional set of at least two cells wired in series, wherein the one or more additional set is wired together in parallel with the first and second sets.

17. The system of claim 15, wherein the network is a cloud-based network.

* * * * *